(12) United States Patent
Liu et al.

(10) Patent No.: US 7,229,332 B2
(45) Date of Patent: Jun. 12, 2007

(54) METHOD FOR MANUFACTURING WHITE LIGHT SOURCE

(75) Inventors: Ru-Shi Liu, Hsien (TW); Hung-Yuan Su, Taipei Hsien (TW); Chien-Yuan Wang, Kaohsiung Hsien (TW); Liang-Sheng Chi, Yun-Lin Hsien (TW)

(73) Assignee: Lite-On Technology Corporation, Taipei (TW)

( * ) Notice: Subject to any disclaimer, the term of this patent is extended or adjusted under 35 U.S.C. 154(b) by 56 days.

(21) Appl. No.: 10/669,461

(22) Filed: Sep. 25, 2003

(65) Prior Publication Data

US 2004/0063372 A1    Apr. 1, 2004

(30) Foreign Application Priority Data

Sep. 29, 2002  (CN) ............................... 02 1 44077

(51) Int. Cl.
*H01J 9/00* (2006.01)
*H01J 1/62* (2006.01)
*C09K 11/54* (2006.01)
*C09K 11/56* (2006.01)

(52) U.S. Cl. .................. 445/23; 252/301.6 S; 313/503
(58) Field of Classification Search ................. 445/23; 252/301.6 S
See application file for complete search history.

(56) References Cited

U.S. PATENT DOCUMENTS

| | | | | |
|---|---|---|---|---|
| 3,602,753 A | * | 8/1971 | Evans et al. ................. | 313/467 |
| 3,657,142 A | * | 4/1972 | Poss ..................... | 252/301.6 S |
| 3,664,862 A | * | 5/1972 | Kingsley et al. ...... | 252/301.6 F |
| 5,043,774 A | * | 8/1991 | Shiki ........................... | 257/99 |
| 5,700,591 A | * | 12/1997 | Okajima et al. ............ | 428/690 |
| 6,165,631 A | * | 12/2000 | Boerner et al. ............. | 428/690 |
| 6,614,179 B1 | * | 9/2003 | Shimizu et al. ............. | 313/512 |
| 6,645,398 B1 | * | 11/2003 | Hampden-Smith et al. ...... | 252/301.4 S |
| 6,833,086 B2 | * | 12/2004 | Kajiwara ............... | 252/301.6 S |

* cited by examiner

*Primary Examiner*—Mariceli Santiago
*Assistant Examiner*—Anne M Hines
(74) *Attorney, Agent, or Firm*—Birch, Stewart, Kolasch & Birch, LLP

(57) ABSTRACT

A method for manufacturing a white light source provides an LED light source and a semiconductor-type phosphor with (Zn, Cd)S being the host with foreign ions added thereto as luminescence centers. The LED light source emits light ranging from 495 nm about (blue-green light) to about 340 nm (ultra-violet).

2 Claims, 7 Drawing Sheets

Experimental CIE chromaticity diagram 405 nm Dice + ZnS-Cd 450 nm Dice + ZnS-Cd 405 nm Dice + ZnS-Cd+BAM 405 nm Dice + ZnS-Cd+YAG 450 nm Dice + YAG

ID FOR MANUFACTURING WHITE
LIGHT SOURCE

This Nonprovisional application claims priority under 35 U.S.C. § 119(a) on Patent Application No(s). 02144077.8 filed in China on Sep. 29, 2002, the entire contents of which are hereby incorporated by reference.

FIELD OF THE INVENTION

The present invention relates to a method for manufacturing a white light source, and especially to a method for manufacturing a white light source having a semiconductor-type phosphor with (Zn, Cd)S being the host matrix with foreign ions added as luminescence centers.

BACKGROUND OF THE INVENTION

A white light source is generally provided by mixing light sources of different wavelengths. For example, a conventional white light source can be realized by mixing red light, green light and blue light with a suitable intensity ratio. Alternatively, the white light source can be realized by mixing yellow light and blue light with a suitable intensity ratio. The conventional method for manufacturing a white light source can be summarized as following:

In a first example of a prior art of white light source, three LED dies based on InGaAlP, InGaN and GaP are packaged into a lamp and emit red light, blue light and green light, respectively. The light emitted from the lamp can be mixed by a lens to provide white light.

In a second example of a prior art of white light source, two LED dies based on InGaN and AlInGaP or GaP emit blue light and yellowish-green light. The blue light and yellowish-green light are mixed to provide white light. The white light sources according to above-mentioned two approaches have an efficiency of 20 lm/W.

A third example of a prior art of white light source is proposed by Nichia Chemical Co., in which an InGaN-based blue LED and a yellow YAG phosphor are used to provide the white light source. This white light source requires a uni-color LED to provide white light with an efficiency of 20 lm/W. Moreover, the phosphor is a mature art and commercially available.

A fourth example of a prior art of white light source is proposed by Sumitomo Electric Industries Ltd., and uses a white-light LED based on ZnSe. A CdZnSe thin film is formed on the surface of a ZnSe crystalline substrate. The CdZnSe thin film emits blue light and the ZnSe crystalline substrate emits yellow light after receiving the blue light from the CdZnSe thin film. The blue light and the yellow light are mixed to provide white light. In this approach, only one LED chip is required and the operation voltage thereof is 2.7 V, less than 3.5 V operation voltage of the GaN based LED. Moreover, no phosphor is required.

In a fifth approach to provide white light source, an ultra-violet LED is used to excite a plurality of phosphors such that the phosphors luminesce lights of different colors for mixing into a white light.

In first and second examples of prior art white light sources, LEDs for multiple colors are required. The color of the white light source is distorted if one of the LEDs malfunctions. Moreover, the driving voltages for LEDs of different colors are also different; this complicates the design of driving circuit.

The third example of a prior art white light source employs a complementary color to achieve a white light. However, the white light produced in this way lacks uniform spectral distribution (especially in 40 nm–700 nm) as exists in natural white light such as sunlight. The white light thus produced has relative chroma, which is, even if indistinguishable to human eyes, differentiable to an instrument such as a camera. Therefore, the color rendering property and reproduction ability are not satisfactory and this white light source is used mainly for lighting.

The fourth example of a prior art white light source has the drawbacks of a low luminescent efficiency (only 8 lm/W) and a short lifetime about 8000 hours.

In the fifth example of a prior art white light source, three phosphors are preferably used to emit three different colors to enhance the color rendering property thereof. However, the phosphors should be prudently chosen to have an absorption band that matches the wavelength of the excitation radiation. Moreover, the phosphors should have compatible absorption coefficients and quantum efficiency to provide white light of high quality. These requirements place a strict constraint on the materials of the phosphors. More seriously, the equation governing the mixed color is nonlinear and the color evolution contour is 2D instead of 1D. The mix ratio is thus hard to optimize.

SUMMARY OF THE INVENTION

It is the object of the present invention to provide a method for manufacturing a white light source having a semiconductor-type phosphor with (Zn, Cd)S being the host matrix with foreign ions added thereto as luminescence centers. The (Zn, Cd)S phosphor emits a light complementary to that of an LED to mix into white light.

In one aspect of the present invention, the semiconductor-type phosphor is adjusted in weight ratio with respect to a packing material.

In another aspect of the present invention, the white light source employs single phosphor.

To achieve above object and aspects, the present invention provides a method for manufacturing a white light source that includes providing a radiation source and providing a semiconductor-type phosphor with (Zn, Cd)S being the host matrix with foreign ions added thereto as luminescence centers. The radiation source emits light ranging from about 495 nm (blue-green light) to 340 nm (ultra-violet).

BRIEF DESCRIPTION OF DRAWING

The various objects and advantages of the present invention will be more readily understood from the following detailed description when read in conjunction with the appended drawing, in which.

DETAILED DESCRIPTION OF THE INVENTION

The present invention is intended to provide a white light source with a semiconductor-type phosphor. This semiconductor-type phosphor has (Zn, Cd)S as the host matrix and at least one type of foreign ion, such as Ag ions, Cu ions or Cl ions, added thereto. The foreign ions added to the host matrix emit fluorescent light after receiving light from an external light source. The external light source can be, for example, an LED with a wavelength of about 495 nm (green-blue) to 345 nm (ultra-violet). The LED is packaged with the semiconductor-type phosphor to form a white light source with a low driving current.

The host matrix of the semiconductor-type phosphor is (Zn, Cd)S and has two major crystal structures. The first major crystal structure is a cubic zincblende structure formed at a low temperature, and the second major crystal structure is a hexagonal wurtzite structure formed at a high temperature. The (Zn, Cd)S host matrix with the hexagonal wurtzite structure has a high light-emitting efficiency and therefore is generally formed by high-temperature calcinations. The (Zn, Cd)S host matrix is crystal structure and its emission radiation wavelength depends on its bandgap. The (Zn, Cd)S host matrix itself does not emit radiation with wavelength in the 350 nm to visible light regime. Foreign ions such as Ag ions are added to the (Zn, Cd)S host matrix and emit radiation after receiving external radiation. To balance the electricity with the Zn and Cd ions for the Ag ions, anion such as Cl⁻ are added. In this case, the cation is referred to as activator and the added anion for balancing electricity is referred to as a co-activator. The activator and the co-activator together constitute a luminescence center.

In the present invention, the white light source comprises an LED lamp and a semiconductor-type phosphor with added foreign ions. The wavelength of emitted radiation of the semiconductor-type phosphor can be varied by adding different ions to the host. Therefore, the emission spectrum can be broadened by adding different ions to the host. The color-rendering property of the white light source comprising the LED lamp and the semiconductor-type phosphor can be greatly improved. In particular, the white light source has a better color-rendering property than the conventional three-wavelength white light, which has a narrow spectrum.

Figure 1A:
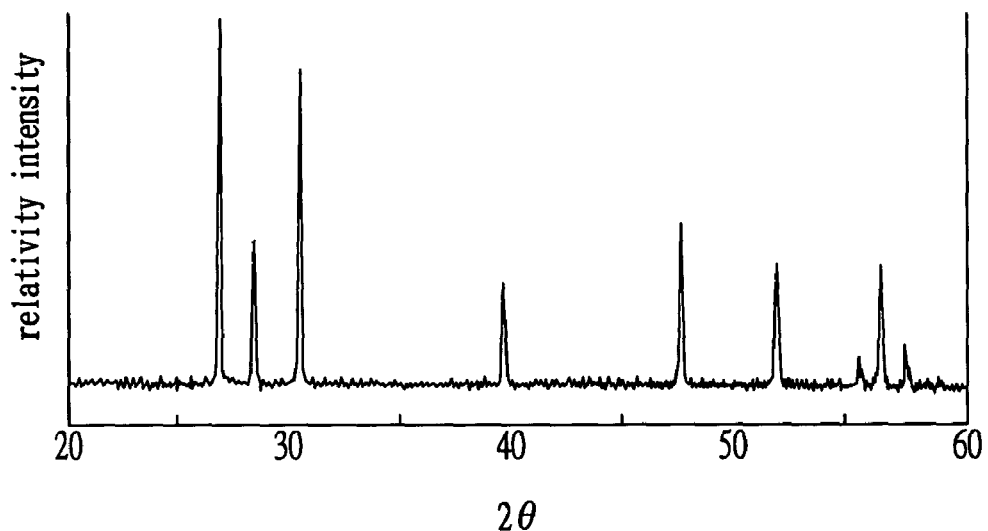
FIG. 1A shows the X-ray diffraction pattern of (Zn, Cd) S: $Ag^+$, $Cl^-$ phosphor according to the present invention.
Figure 1B:
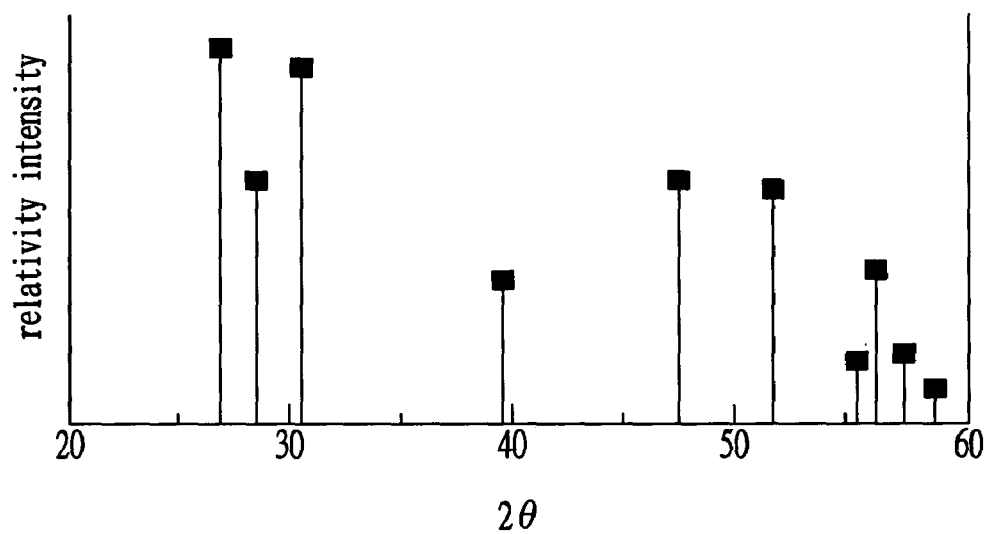
FIG. 1B shows the X-ray diffraction pattern of ZnS: $Ag^+$, $Cl^-$ phosphor according to the present invention.
Figure 2A:
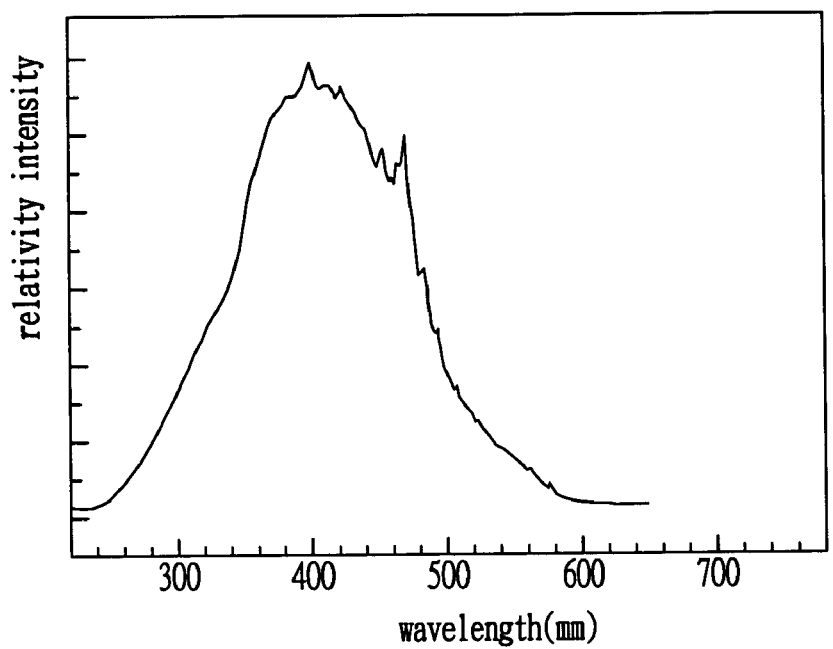
FIG. 2A shows the emission spectrum of the (Zn, Cd) S: $Ag^+$, $Cl^-$ phosphor according to the present invention.
Figure 2B:
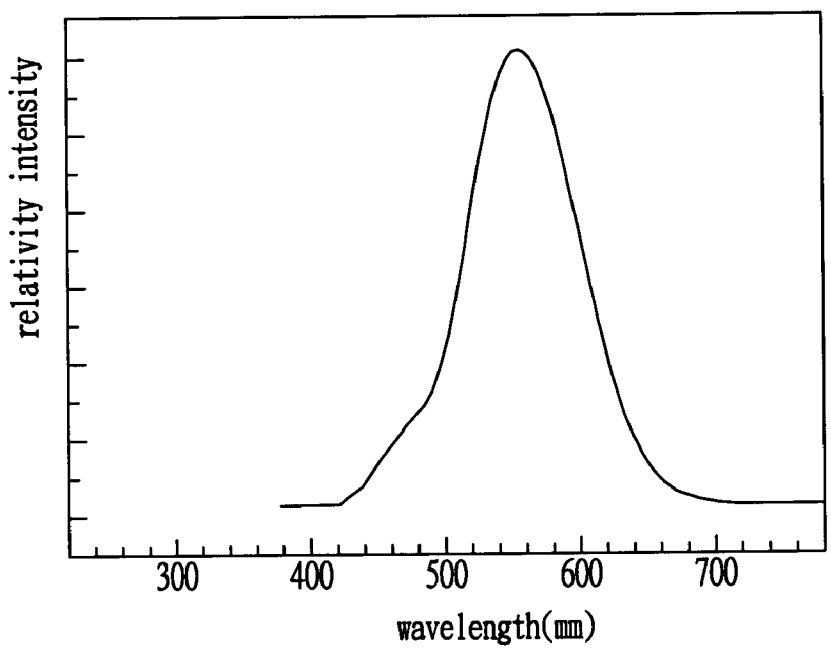
FIG. 2B shows the emission spectrum of the ZnS: $Ag^+$, $Cl^-$ phosphor according to the present invention.
Figure 3:
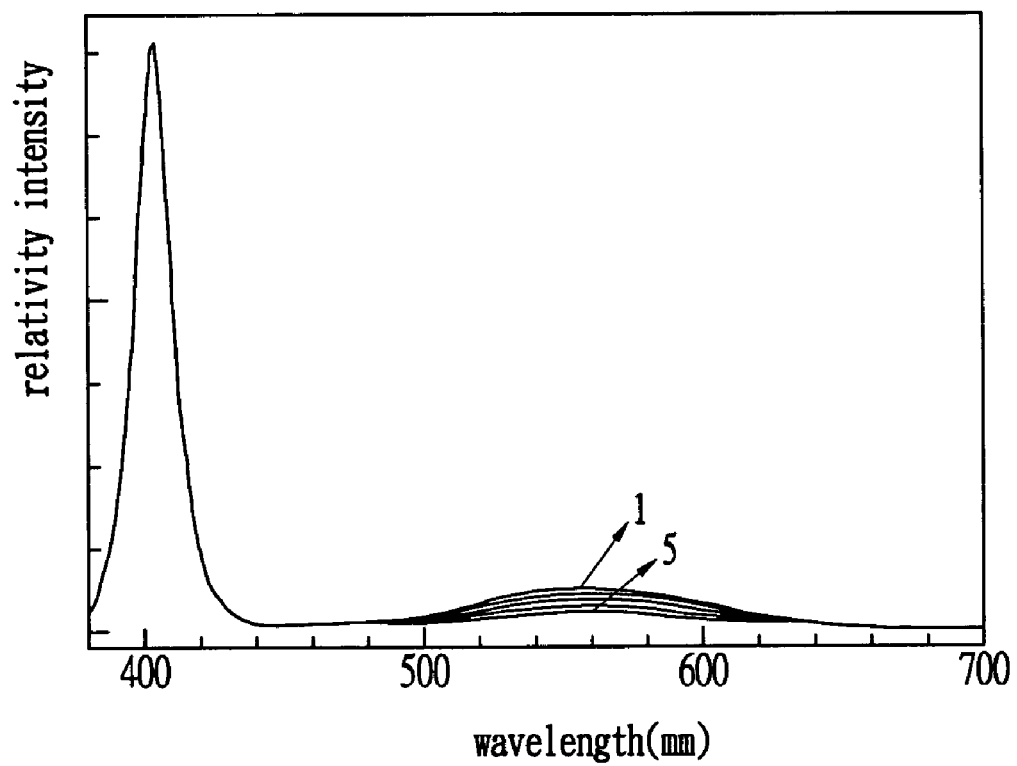
FIG. 3 shows the spectrum of the (Zn, Cd) S: $Ag^+$, $C^-$ phosphor mixed with epoxy in different ratios and excited by a 405 nm blue-purple LED according to the present invention.
Figure 4:
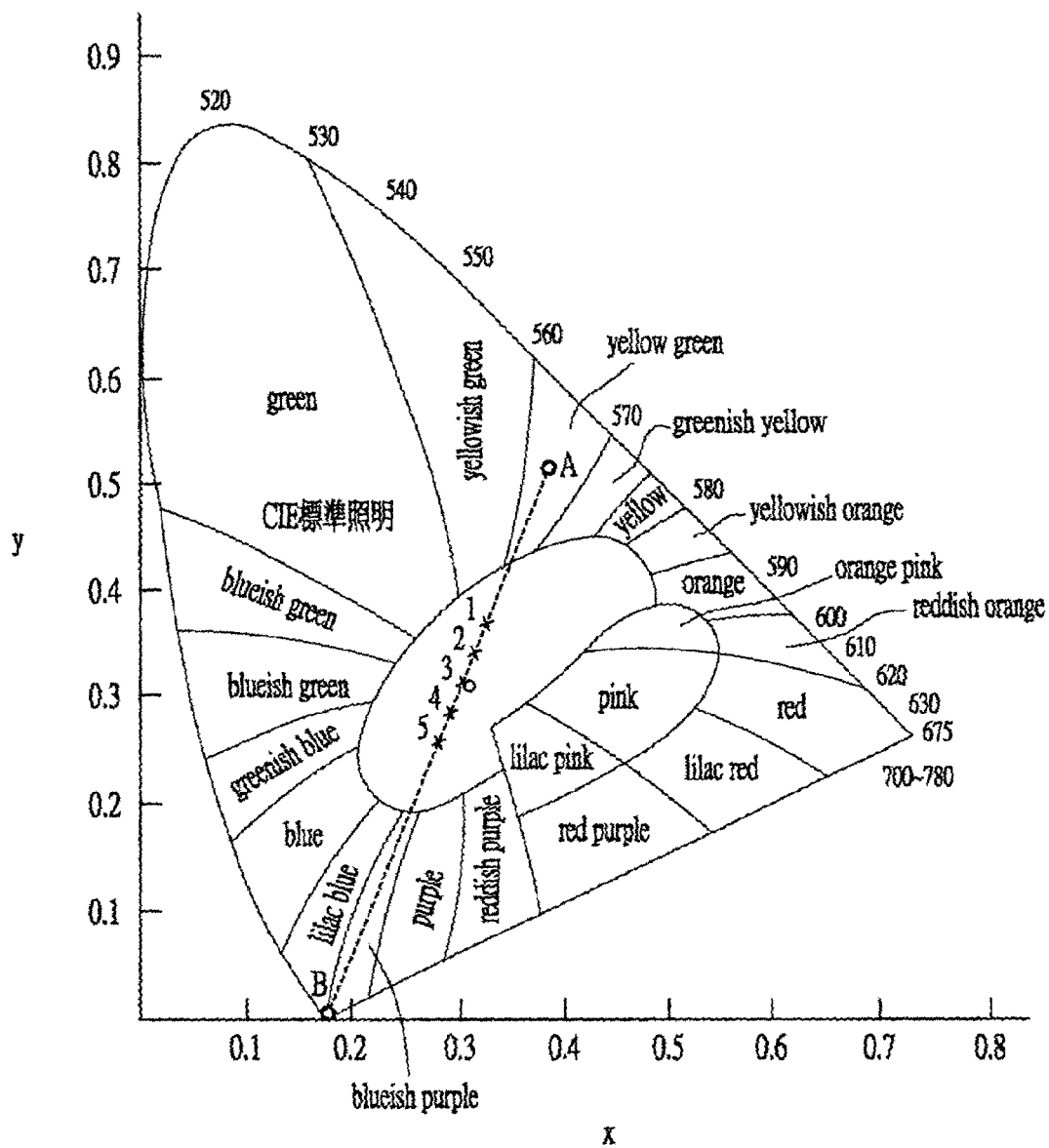
FIG. 4 shows a CIE chart for the data in FIG. 3.

Following is an example of a method for manufacturing the white light source of the present invention:

step 1. Synthesizing a semiconductor-type (Zn, Cd)S phosphor such as (Zn, Cd) S: $Ag^+$, $Cl^-$. The synthesizing process can be one of chemosynthesis, solid-gas sintering, direct reaction or organic metal thermal decomposition.

step 2: Analyzing the crystallinity of the synthesized phosphor by X-ray diffraction. The results are shown in FIG. 1A. The comparison sample of (JCPDS, No. 79-2204) is shown in FIG. 1B. As can be seen from those figures, the semiconductor-type (Zn, Cd)S phosphor of the present invention is single-phase hexagonal wurtzite structure.

step 3: Measuring the spectrum of the semiconductor-type (Zn, Cd)S phosphor of the present invention with reference to a wavelength of 554 nm. As shown in FIG. 2A, the (Zn, Cd) S: $Ag^+$, $Cl^-$ phosphor can be excited by radiation with wavelength from 495 nm to 340 nm.

step 4: Measuring the emission spectrum of the (Zn, Cd) S: $Ag^+$, $Cl^-$ phosphor excited by an ultraviolet light. As shown in FIG. 2B, the (Zn, Cd) S: $Ag^+$, $Cl^-$ phosphor emits a yellow-green light after being excited by the ultraviolet light. The color coordinate of the red light is determined with reference to 1931 CIE (Commission Internationale de l'Eclairage) chromaticity diagram and is marked by letter "A" in FIG. 4.

step 5: Mixing the (Zn, Cd) S: $Ag^+$, $Cl^-$ phosphor with epoxy at different weight ratio. For example, the weight ratio of (Zn, Cd) S: $Ag^+$, $Cl^-$ phosphor/epoxy can be 0, 0.1, 0.14, 0.18 and 0.22. The resulting mixture is radiated by a 405 nm blue-purple LED. As shown in FIG. 3, the yellow component is reduced when the weight ratio of the phosphor is reduced from data 1 to data 5.

step 6: Drawing a dashed straight line connecting points A and B in FIG. 4, in which point B represents the ratio of the (Zn, Cd) S: $Ag^+$, $Cl^-$ phosphor being zero. As can be seen from FIG. 4, the dashed straight line passes through a white light region in the CIE chromaticity diagram. Moreover, the line determined by points A and B also passes through the five data points in step 5. The mixture of the (Zn, Cd) S: $Ag^+$, $Cl^-$ phosphor and epoxy obeys a linear relationship for emitting wavelength.

To sum up, the white light source provided by the present invention has particular advantages over prior art white light sources as follows:

1. The white light source of the present invention employs only one LED with one phosphor. The structure is simpler than convention three-wavelength white light sources.

2. The emission wavelength of the semiconductor-type phosphor of the present invention can be changed by adding different ions as luminescence centers. The semiconductor-type phosphor of the present invention can emit light of multiple wavelengths, while a conventional phosphor can only emit light of a single wavelength.

3. The emitting wavelength of the semiconductor-type phosphor of the present invention can be changed by adding different ions. The white light source employing the semiconductor-type phosphor has a spectral property similar to that of the conventional three-wavelength white light source.

4. The (Zn, Cd) S phosphor can be excited by radiation ranging from 495 nm (blue-green light) to 340 nm (ultra-violet). Therefore, it has broad applicability.

Below is list experimental data for a white light LED with ZnS-Cd phosphor.

A. Experiment Description

1. The sample is packaged by 5 nm standard lamp technology in which ZnS-Cd/BAM/YAG phosphors are assembled with a 405 nm/450 nm blue LED.

2. There are five sets of experimental data with sets 1 to 3 being the experimental sets and sets 4 and 5 being the comparison sets. The target coordinate is (0.30, 0.31).

| No | phosphor | blue LED | description |
|---|---|---|---|
| 1 | ZnS-Cd | 405 nm | wavelength $\lambda_p$ |
| 2 | ZnS-Cd | 450 nm | wavelength $\lambda_d$ |
| 3 | ZnS-Cd + BAM | 405 nm | wavelength $\lambda_p$ |
| 4 | ZnS-Cd + YAG | 405 nm | wavelength $\lambda_p$ |
| 5 | YAG | 450 nm | wavelength $\lambda_d$ |

B. Testing Data

Figure 5:
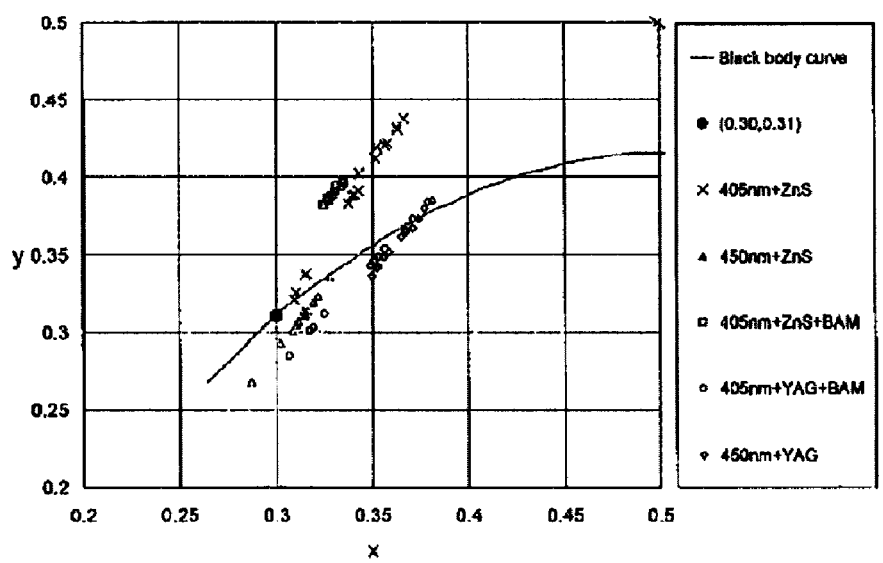
FIG. 5 is an experimental CIE chromaticity diagram.
Figure 6:
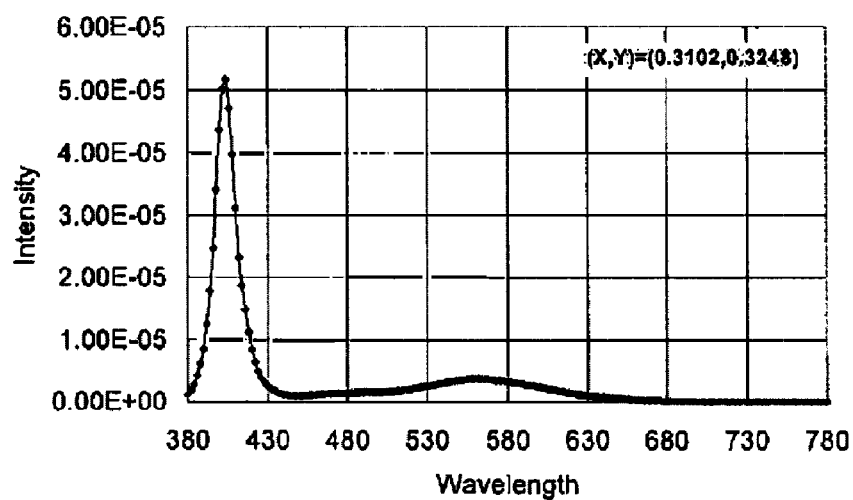
FIGS. 6-10 are spectrum graphs of experimental data for five samples.
Figure 7:
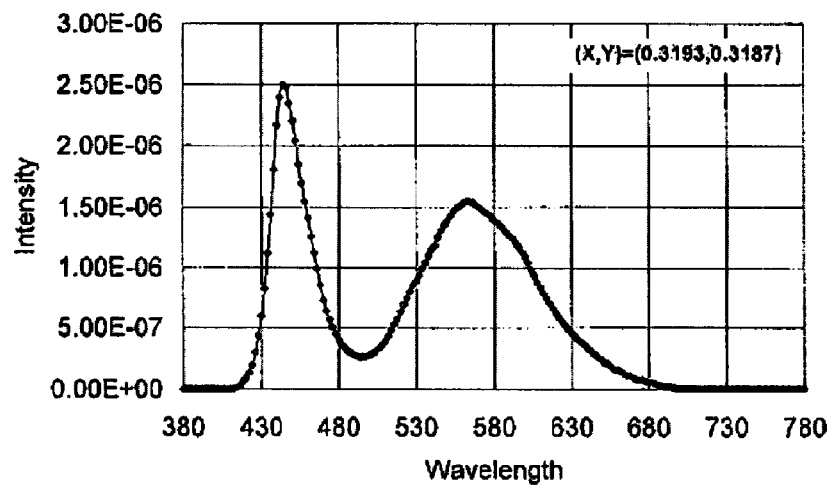
Figure 8:
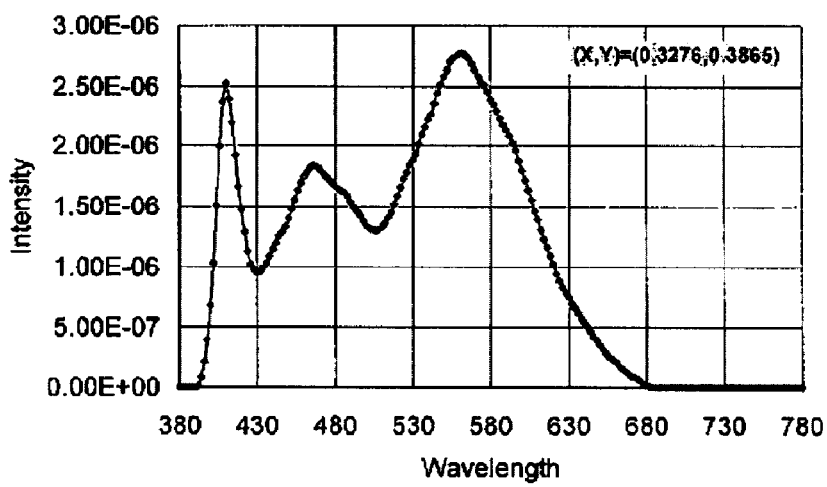
Figure 9:
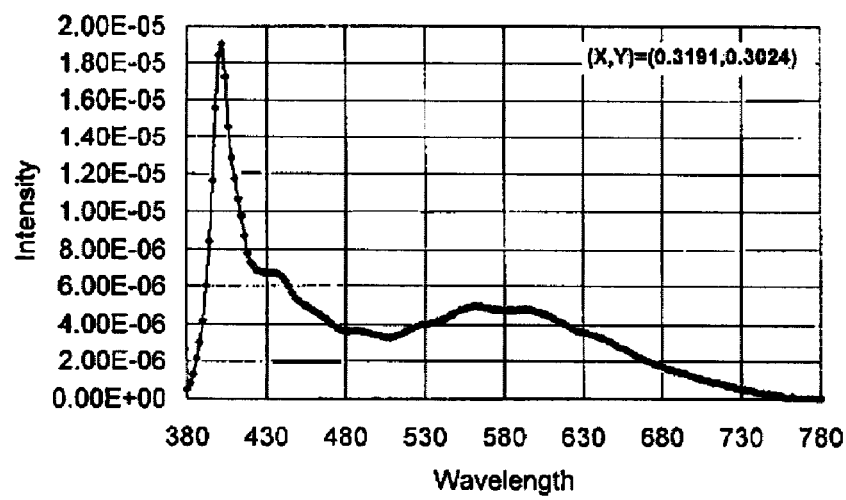
Figure 10:
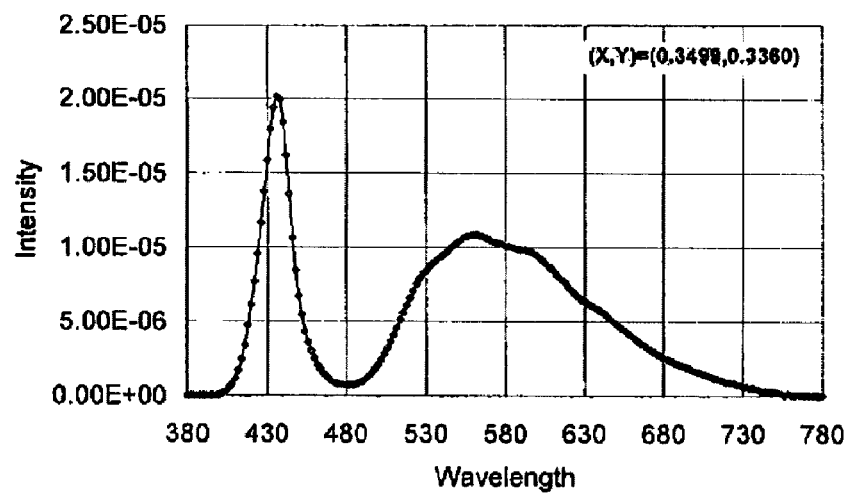

FIG. 5 is a graph showing the experimental CIE chromoticity diagram with data points for five samples in comparison to a black body curve. FIGS. 6–10 each show an experimental spectrum of one of the five samples.

C. Data Analysis

1. All of the data in the experimental sets can produce white light and the CIE coordinate of the ZnS—Cd phosphor with 405 nm blue LED is closest to the target coordinate of (0.30, 0.31). The ZnS—Cd phosphor with 450 nm blue LED is second in effect, and the ZnS—Cd+BAM phosphor with 450 nm blue LED is third in effect.

2. According to the above results, the ZnS—Cd phosphor with the 405–450 nm blue LED can produce white light.

Although the present invention has been described with reference to the preferred embodiment thereof, it will be understood that the invention is not limited to the details thereof. Various substitutions and modifications have suggested in the foregoing description, and other will occur to those of ordinary skill in the art. For example, other ions can be added in the ZnS—Cd phosphor. The excited radiation can be provided by electron beam or plasma. Therefore, all such substitutions and modifications are intended to be embraced within the scope of the invention as defined in the appended claims.

What is claimed is:

1. A method for manufacturing a white light source, the method including following steps:

providing a light emitting diode emitting light ranging from about 440 nm (blue light) to 340 nm (ultra-violet); and providing a semiconductor-type phosphor with $Zn_xCd_{1-x}S:M,N(0<X<X1)$ being a host matrix with foreign ions added thereto as luminescence centers, wherein M is one of Ag ion, Cu ion and Cl ion or a combination thereof, and N is one of Ag ion, Cu ion and Cl ion or a combination thereof.

2. The method for manufacturing a white light source as in claim 1, wherein the semiconductor-type phosphor is prepared by solid-gas sintering.

* * * * *